(12) United States Patent
Zurek et al.

(10) Patent No.: US 9,185,199 B2
(45) Date of Patent: Nov. 10, 2015

(54) METHOD AND APPARATUS FOR ACOUSTICALLY CHARACTERIZING AN ENVIRONMENT IN WHICH AN ELECTRONIC DEVICE RESIDES

(71) Applicant: Google Technology Holdings LLC, Mountain View, CA (US)

(72) Inventors: Robert A Zurek, Antioch, IL (US); Joel A Clark, Woodridge, IL (US); Joseph C Dwyer, Downers Grove, IL (US); Juan C Garcia, Grayslake, IL (US); Plamen A Ivanov, Schaumburg, IL (US); Rivanaldo S Oliveira, Grayslake, IL (US); Snehitha Singaraju, Gurnee, IL (US); Jincheng Wu, Naperville, IL (US)

(73) Assignee: Google Technology Holdings LLC, Mountain View, CA (US)

( * ) Notice: Subject to any disclaimer, the term of this patent is extended or adjusted under 35 U.S.C. 154(b) by 189 days.

(21) Appl. No.: 13/956,076

(22) Filed: Jul. 31, 2013

(65) Prior Publication Data
US 2014/0274212 A1    Sep. 18, 2014

Related U.S. Application Data

(60) Provisional application No. 61/827,388, filed on May 24, 2013, provisional application No. 61/776,793, filed on Mar. 12, 2013, provisional application No. 61/798,097, filed on Mar. 15, 2013.

(51) Int. Cl.
*H04M 1/60* (2006.01)
*G10L 15/20* (2006.01)
(Continued)

(52) U.S. Cl.
CPC ............. *H04M 1/6041* (2013.01); *G10L 15/06* (2013.01); *G10L 15/20* (2013.01); *G10L 15/22* (2013.01);
(Continued)

(58) Field of Classification Search
CPC .......................... H04M 1/6033; G10L 15/265
USPC ............ 455/563, 569.1, 567, 570, 557, 90.1, 455/67.11, 67.7, 511, 41.2, 556.1; 704/233, 704/231, 243
See application file for complete search history.

(56) References Cited

U.S. PATENT DOCUMENTS

| | | | |
|---|---|---|---|
| 6,542,436 B1 * | 4/2003 | Myllyla ........................... | 367/95 |
| 2003/0236099 A1 | 12/2003 | Deisher et al. | |
| 2008/0144864 A1 * | 6/2008 | Huon ............................ | 381/305 |
| 2011/0196522 A1 * | 8/2011 | Zakirov ......................... | 700/94 |

(Continued)

FOREIGN PATENT DOCUMENTS

| | | |
|---|---|---|
| EP | 1174732 A2 | 1/2002 |
| WO | 2011110901 A1 | 9/2011 |
| WO | WO 2012/063104 A1 | 5/2012 |

OTHER PUBLICATIONS

International Search Report and Written Opinion issued by the European Patent Office, dated Apr. 9, 2014, for related International Application No. PCT/US2014/014759; 11 pages.

(Continued)

*Primary Examiner* — John J Lee
(74) *Attorney, Agent, or Firm* — Faegre Baker Daniels LLP

(57) ABSTRACT

A method and apparatus for adapting acoustic processing in a communication device, and capturing at least one acoustic signal using acoustic hardware of the communication device, characterizing an acoustic environment external to the communication device using the at least one captured acoustic signal, adapting acoustic processing within the communication device based on the characterized acoustic environment.

20 Claims, 11 Drawing Sheets

(51) Int. Cl.
*G10L 15/22* (2006.01)
*G10L 21/02* (2013.01)
*G10L 25/48* (2013.01)
*G10L 15/06* (2013.01)
*G10L 15/065* (2013.01)
*G10L 21/0316* (2013.01)
*G10L 21/0216* (2013.01)
*H03G 3/32* (2006.01)
*H04M 1/27* (2006.01)
*G10L 21/0208* (2013.01)

(52) U.S. Cl.
CPC ................. *G10L 21/02* (2013.01); *G10L 25/48* (2013.01); *G10L 15/063* (2013.01); *G10L 15/065* (2013.01); *G10L 21/0316* (2013.01); *G10L 2015/228* (2013.01); *G10L 2021/02082* (2013.01); *G10L 2021/02161* (2013.01); *H03G 3/32* (2013.01); *H04M 1/271* (2013.01)

(56) References Cited

U.S. PATENT DOCUMENTS

2012/0263019 A1 10/2012 Armstong-Muntner
2012/0310637 A1 12/2012 Vitte et al.

OTHER PUBLICATIONS

Cohen, Israel, "Relative Transfer Function Identification Using Speech Signals", IEEE Transaction on Speech and Audio Processing, Sep. 2004, pp. 451-459, vol. 12, No. 5.

Kevin Fnik, "Multi-Microphone Signal Acquisition for Speech Recognition Systems" http://www.fink.com/papers/ee586.html, Mar. 18, 2013, 15 pages.

* cited by examiner

METHOD AND APPARATUS FOR ACOUSTICALLY CHARACTERIZING AN ENVIRONMENT IN WHICH AN ELECTRONIC DEVICE RESIDES

RELATED APPLICATIONS

The present application is related to and claims benefit under 35 U.S.C. §119(e) of U.S. Provisional Patent Application No. 61/776,793, filed Mar. 12, 2013, titled "VOICE RECOGNITION FOR A MOBILE DEVICE"; U.S. Provisional Patent Application No. 61/798,097, filed Mar. 15, 2013, titled "VOICE RECOGNITION FOR A MOBILE DEVICE"; and U.S. Provisional Patent Application No. 61/827,388, filed May 24, 2013, titled "METHOD AND APPARATUS FOR ACOUSTICALLY CHARACTERIZING AN ENVIRONMENT IN WHICH AN ELECTRONIC DEVICE RESIDES", which are commonly owned with this application by Motorola Mobility LLC, and the entire contents of each are incorporated herein by reference.

FIELD OF THE DISCLOSURE

The present disclosure relates to electronic devices such as mobile devices and, more particularly, to methods and systems for performing acoustic processing at or in relation to such electronic devices.

BACKGROUND

Mobile devices such as cell phones, personal digital assistants (PDAs), and smart phones, as well as a variety of other electronic devices, include acoustic processing functions that increasingly contain voice recognition capabilities. Through their ability to recognize incoming voice signals from users (or others), such mobile devices or other electronic devices are able to achieve high levels of interactivity with the users (or others) and to provide numerous valuable functions that depend upon voice input.

Although technologies for performing acoustic processing including voice recognition have been improving, accurate voice recognition remains a technical challenge. Although a variety of voice recognition technologies have been developed including, for example, acoustic matching and speech-to-text voice recognition, existing voice recognition technologies nevertheless each have their own strengths and weaknesses.

Therefore, although any given mobile device or other electronic device will typically be designed to utilize a particular type of acoustic processing technology deemed to be suitable for the mobile device or other electronic device (or the particular applications on or performance goals for such mobile device or other electronic device) on which it is being implemented, nevertheless the implementation of the acoustic processing technology for voice recognition on the mobile device or other electronic device will be limited in certain respects.

BRIEF DESCRIPTION OF THE FIGURES

The accompanying figures, where like reference numerals refer to identical or functionally similar elements throughout the separate views, together with the detailed description below, are incorporated in and form part of the specification, and serve to further illustrate embodiments of concepts that include the claimed invention, and explain various principles and advantages of those embodiments.

Figure 1:
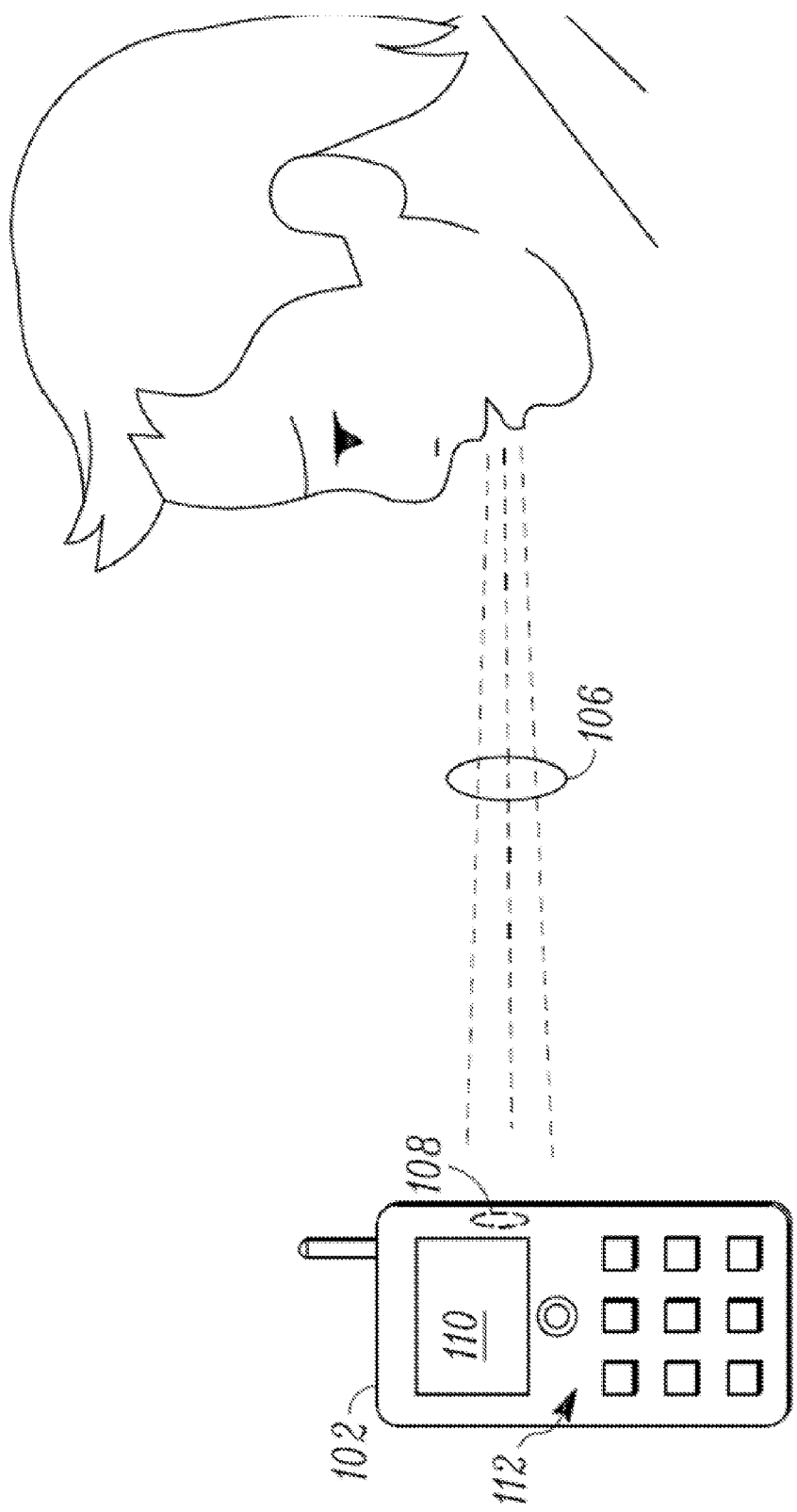
FIG. 1 is a schematic diagram of an example electronic device that, in the present example, is a mobile device, on which may be implemented methods or systems for acoustic processing (or which itself may constitute such a system) in accordance with embodiments disclosed herein.

Skilled artisans will appreciate that elements in the figures are illustrated for simplicity and clarity and have not necessarily been drawn to scale. For example, the dimensions of some of the elements in the figures may be exaggerated relative to other elements to help to improve understanding of embodiments of the present invention. In addition, the description and drawings do not necessarily require the order illustrated. It will be further appreciated that certain actions and/or steps may be described or depicted in a particular order of occurrence while those skilled in the art will understand that such specificity with respect to sequence is not actually required.

The apparatus and method components have been represented where appropriate by conventional symbols in the drawings, showing only those specific details that are pertinent to understanding the embodiments of the present invention so as not to obscure the disclosure with details that will be readily apparent to those of ordinary skill in the art having the benefit of the description herein.

DETAILED DESCRIPTION

Generally speaking, pursuant to the various embodiments, the present disclosure provides a method and apparatus for adapting acoustic processing in a communication device. The method includes capturing at least one acoustic signal using acoustic hardware of the communication device, characterizing an acoustic environment external to the communication device using the at least one captured acoustic signal. The method also includes adapting acoustic processing within the communication device based on the characterized acoustic environment. The acoustic processing can include, but is not limited to, voice recognition processing such as processing during a normal voice recognition operation and/or during a training and/or enrollment operation, processing of voice calls, etc.

The present disclosure also provides for a communication device configurable based on an acoustic environment. In one embodiment, the communication device includes acoustic hardware configured to emit a first acoustic signal and to capture at least one acoustic signal comprising at least one of ambient sound or at least one reflection of the first acoustic signal. The communication device also includes a processor configured to characterize an acoustic environment external to the communication device using the at least one captured acoustic signal, and an acoustic system configured to provide acoustic processing of a received acoustic signal, wherein the acoustic processing system is adaptable based on the characterized acoustic environment.

Referring to the drawings, and in particular to FIG. 1, an example mobile device 102 is illustrated on which may be implemented methods or constitute a system for acoustic processing which supports voice recognition in accordance with embodiments disclosed herein. The mobile device 102 communicates with a user 104. More particularly, as shown, the user 104 provides voice input (or vocalized information or speech) 106 that is detected by the mobile device 102 by way of a microphone (or other sound receiver) 108. The voice input is provided, for instance, while giving a command or other voice sample during a voice recognition operation or as speech during a voice call. Further as shown, in the present embodiment the mobile device 102 includes a touch screen display 110 that is both able to display visual images and also able to receive or sense touch type inputs as provided by way of a user's finger or other touch input device such as a stylus.

Notwithstanding the presence of the touch screen display 110, in the present embodiment the mobile device 102 also has a number of discrete keys or buttons 112 that serve as input devices of the mobile device 102. However, in other embodiments such keys or buttons (or any particular number of such keys or buttons) need not be present, and rather the touch screen display 110 serves as the primary or only tactile user input device. Although FIG. 1 particularly shows the mobile device 102 as including the touch screen display 110 and keys or buttons 112, these features are only intended to be examples of components/features on a mobile device, and in other embodiments the mobile device 102 need not include one or more of these features and/or may include other features in addition to or instead of these features.

The mobile device 102 is intended to be representative of a variety of mobile devices including, for example, cellular telephones, personal digital assistants (PDAs), smart phones, or other handheld or portable electronic devices. In alternate embodiments, the mobile device is a headset (e.g., a Bluetooth headset), MP3 player, battery-powered device, a watch device (e.g., a wristwatch) or other wearable device, radio, navigation device, laptop or notebook computer, netbook, pager, PMP (personal media player), DVR (digital video recorders), gaming device, camera, e-reader, e-book, tablet device, navigation device with video capable screen, multimedia docking station, or other mobile device.

Additionally, although FIG. 1 particularly shows the mobile device 102, the mobile device is intended to be representative not only of mobile devices but also of other electronic devices. Indeed, embodiments of the present disclosure are intended to be applicable to any of a variety of electronic devices that are capable of or configured to receive voice input or other sound inputs that are indicative or representative of vocalized information. Moreover, embodiments of the present disclosure are intended to be applicable to any of a variety of electronic devices that are capable of or configured to perform acoustic processes including voice recognition processes on the received voice input or other sound input.

Figure 2:
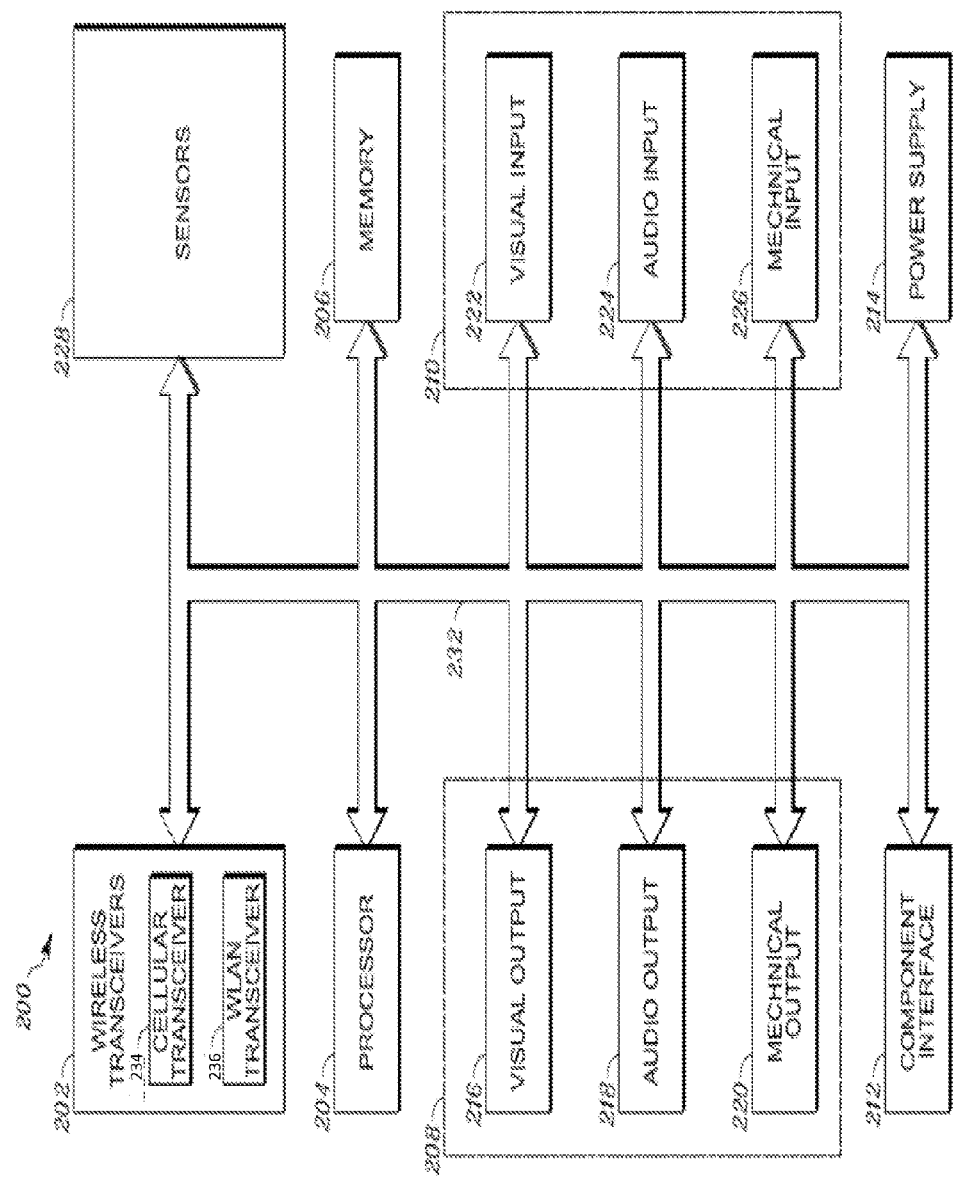
FIG. 2 is a block diagram showing example components of the mobile device of FIG. 1.

Referring to FIG. 2, there is provided a block diagram illustrating example internal components 200 of the mobile device 102 of FIG. 1, in accordance with the present embodiment. As shown in FIG. 2, the internal components 200 include one or more wireless transceivers 202, a processor 204 (e.g., a microprocessor, microcomputer, application-specific integrated circuit, digital signal processor, etc.), a memory portion 206, one or more output devices 208, and one or more input devices 210. In the embodiment shown, the internal components 200 further include a component interface 212 to provide a direct connection to auxiliary components or accessories for additional or enhanced functionality. In this embodiment, the internal components 200 also include a power supply 214, such as a battery, for providing power to the other internal components while enabling the mobile device 102 to be portable. Further, the internal components 200 additionally include one or more sensors 228. As further illustrated, the internal components 200 are coupled to one another, and in communication with one another, by way of one or more internal communication links 232 (e.g., an internal bus).

Further, in the present embodiment of FIG. 2, the wireless transceivers 202 particularly include a cellular transceiver 234 and a Wireless Fidelity (Wi-Fi) transceiver 236. More particularly, the cellular transceiver 234 is configured to conduct cellular communications, such as Third Generation (3G), Fourth Generation (4G), 4G Long Term Evolution (LTE), vis-à-vis cell towers (not shown). In other embodiments, the cellular transceiver 234 is configured to utilize any of a variety of other cellular-based communication technologies such as analog communications (using Advanced Mobile Phone System—AMPS), digital communications (using Code Division Multiple Access—CDMA, Time Division Multiple Access—TDMA, Global System for Mobile communication—GSM, integrated Digital Enhanced Network—iDEN, General Packet Radio Service—GPRS, Enhanced Data for GSM Evolution—EDGE, etc.), and/or next generation communications (using Universal Mobile Telecommunication System—UMTS, Wideband CDMA—WCDMA, LTE, Institute of Electrical and Electronics Engineers—IEEE 802.16, etc.) or variants thereof.

By contrast, the Wi-Fi transceiver 236 is a wireless local area network (WLAN) transceiver 236 configured to conduct Wi-Fi communications in accordance with the IEEE 802.11 (a, b, g, or n) standard with access points. In other embodiments, the Wi-Fi transceiver 236 instead (or in addition) conducts other types of communications commonly understood as being encompassed within Wi-Fi communications such as some types of peer-to-peer (e.g., Wi-Fi Peer-to-Peer) communications. Further, in other embodiments, the Wi-Fi transceiver 236 is replaced or supplemented with one or more other wireless transceivers configured for non-cellular wireless communications including, for example, wireless transceivers employing ad hoc communication technologies such as HomeRF (radio frequency), Home Node B (3G femtocell), Bluetooth and/or other wireless communication technologies such as infrared technology.

Although in the present embodiment the mobile device 102 has two wireless transceivers 202 (that is, the transceivers 234 and 236), the present disclosure is intended to encompass numerous embodiments in which any number of wireless transceivers employing any number of communication technologies are present. Moreover, additional types of transceivers can be included in the wireless transceivers 202. In one example implementation, the wireless transceivers 202 include one or more transceivers used to determine the location of the device 102, such as a Global Positioning System (GPS) transceiver (not shown) and/or a triangulation receiver, which may or may not be implemented by the cellular transceiver 234. By using the wireless transceivers 202, the mobile device 102 can communicate with any of a variety of other devices or systems (not shown) including, for example, other mobile devices, web servers, cell towers, access points, other remote devices, etc. Depending upon the embodiment or circumstance, wireless communication between the mobile device 102 and any number of other devices or systems may be achieved.

Operation of the wireless transceivers 202 in conjunction with others of the internal components 200 of the mobile device 102 may take a variety of forms. For example, operation of the wireless transceivers 202 may proceed in a manner in which, upon reception of wireless signals, the internal components 200 detect communication signals and the transceivers 202 demodulate the communication signals to recover incoming information, such as voice and/or data, transmitted by the wireless signals. After receiving the incoming information from the transceivers 202, the processor 204 formats the incoming information for the one or more output devices 208. Likewise, for transmission of wireless signals, the processor 204 formats outgoing information, which may but need not be activated by the input devices 210, and conveys the outgoing information to one or more of the wireless transceivers 202 for modulation so as to provide modulated communication signals to be transmitted.

Processing, by the processor 204 and/or other acoustic processing elements, of incoming or outgoing voice information within an acoustic signal during a voice call is referred to herein as processing of voice calls. By contrast, processing, by the processor 204 and/or other acoustic processing elements, of incoming voice information within an acoustic signal to determine, detect, and or recognize one or more spoken words within the voice information acoustic signal is referred to herein as voice recognition processing.

Depending upon the embodiment, the input and output devices 208, 210 of the internal components 200 include a variety of visual, audio and/or mechanical outputs. For example, the output device(s) 208 include one or more visual output devices 216 such as the display 110 of FIG. 1, a liquid crystal display and/or light emitting diode indicator, one or more audio output devices 218 such as a speaker, alarm, and/or buzzer, and/or one or more mechanical output devices 220 such as a vibrating mechanism. The visual output devices 216 among other things also include a video screen.

Likewise, by example, the input device(s) 210 include one or more visual input devices 222 such as the display 110 of FIG. 1, an optical sensor (for example, a camera lens and photosensor), one or more acoustic input devices 224 such as the microphone 108 of FIG. 1 (or further, for example, one or more other microphones as in a directional microphone and beam former arrangement or a microphone of a Bluetooth headset), and/or one or more mechanical input devices 226 such as a flip sensor, keyboard, keypad (e.g., 112 of FIG. 1), selection button, navigation cluster, touch pad, capacitive sensor, motion sensor, and/or switch. Operations that actuate one or more of the input devices 210 include not only the physical pressing/actuation of buttons or other actuators, but also include, for example, opening the mobile device, unlocking the device, moving the device to actuate a motion, moving the device to actuate a location positioning system, and operating the device.

As mentioned above, this embodiment of internal components 200 also includes one or more of various types of sensors 228 as well as a sensor hub to manage one or more functions of the sensors. The sensors 228 includes, for example, proximity sensors (e.g., a light detecting sensor, an ultrasound transceiver or an infrared transceiver), touch sensors, altitude sensors, and one or more location/orientation circuits/components that includes, for example, an accelerometer, a tilt sensor, a gyroscope, or any other information collecting device that identifies a current location, orientation, or user-device interface (carry mode) of the mobile device 102.

Although the sensors 228 for the purposes of FIG. 2 are considered to be distinct from the input devices 210, in other embodiments it is possible that one or more of the input devices constitutes one or more of the sensors (and vice-versa). Additionally, although in the present embodiment the input devices 210 are shown to be distinct from the output devices 208, it should be recognized that in some embodiments one or more devices serve both as input device(s) and output device(s). In particular, in the present embodiment in which the mobile device 102 includes the touch screen display 110, the touch screen display constitutes both a visual output device and a mechanical input device (by contrast, the keys or buttons 112 are merely mechanical input devices).

The memory portion 206 of the internal components 200 encompasses, in some embodiments, one or more memory devices of any of a variety of forms (e.g., read-only memory, random access memory, static random access memory, dynamic random access memory, etc.), and the processor 204 uses the memory device(s) to store and retrieve data. In some embodiments, the memory portion 206 is integrated with the processor 204 in a single device (e.g., a processing device including memory or processor-in-memory (PIM)), albeit such a single device still typically has distinct portions/sections that perform the different processing and memory functions and that are considered, in one example, separate devices. In some alternate embodiments, the memory portion 206 of the mobile device 102 is supplemented or replaced by other memory portion(s) located elsewhere apart from the mobile device and, in such embodiments, the mobile device is in communication with or access such other memory device(s) by way of any of various communications techniques, for example, wireless communications afforded by the wireless transceivers 202, or connections via the component interface 212.

The data that is stored by the memory portion 206 includes, but need not be limited to, operating systems, programs (applications), and informational data. Each operating system includes executable code that controls basic functions of the mobile device 102, such as interaction among the various components included among the internal components 200, communication with external devices via the wireless transceivers 202 and/or the component interface 212, and storage and retrieval of programs and data, to and from the memory portion 206. As for programs, each program includes executable code that utilizes an operating system to provide more specific functionality, such as file system service and handling of protected and unprotected data stored in the memory portion 206. Such programs include, among other things, programming for enabling the mobile device 102 to perform acoustic processing such as the processing for voice recognition and/or voice calls as illustrated by reference to FIGS. 3-11 and discussed further below. Finally, with respect to informational data, this is non-executable code or information that an operating system or program references and/or manipulates, in one embodiment, for performing functions of the mobile device 102.

Figure 3:
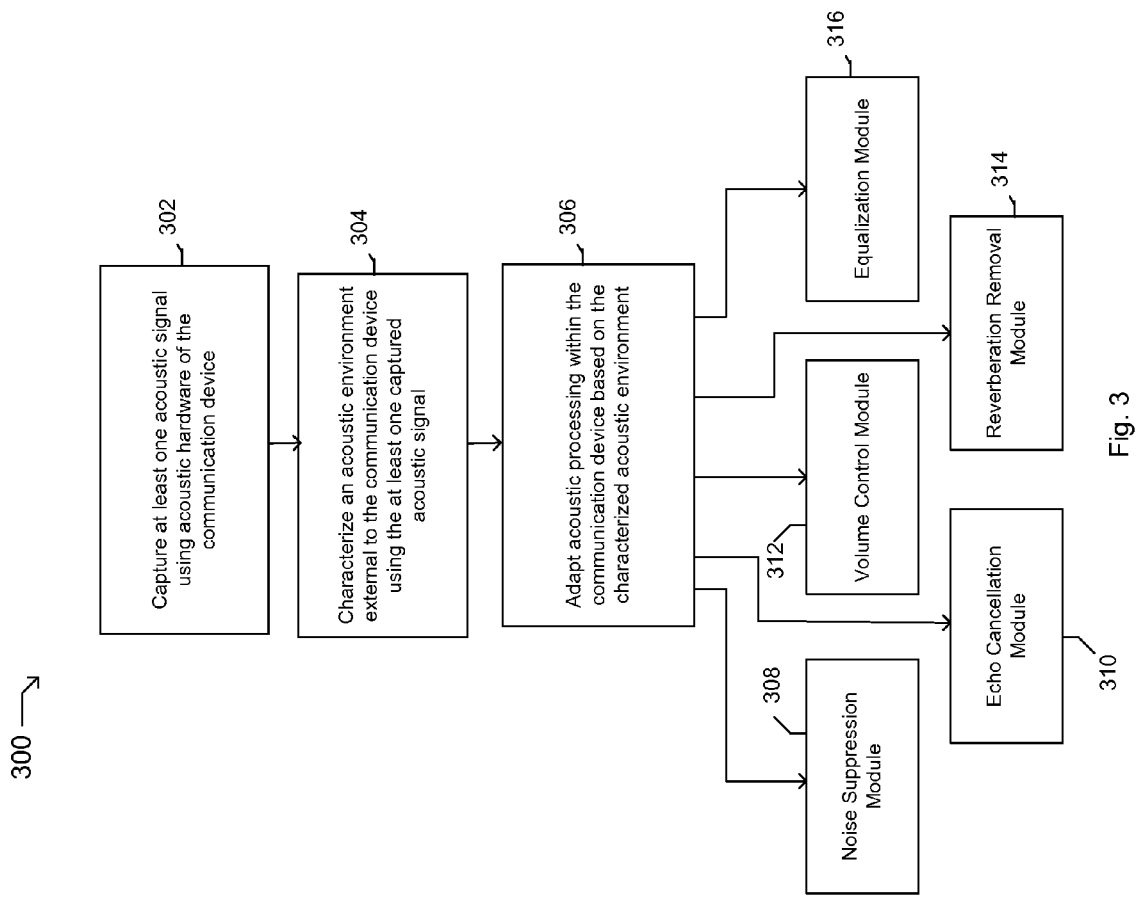
FIG. 3 is a logical flowchart illustrating a method for adapting acoustic processing in a communication device.

Turning now to FIG. 3 which shows one example of a method 300 for adapting acoustic processing in a communication device, such as mobile device 102. The method 300, in one example executes on the communication device 102 and more particularly, the method 300 executes on and/or is implemented by one or more processors, such as processor 204 of the communication device 102 and other supporting hardware shown in and described by reference to FIG. 2. Accordingly, "adapted," "operative," "capable" or "configured," as used herein, means that the indicated elements, components or modules are implemented using one or more hardware devices such as one or more operatively coupled processing cores, memory devices, and interfaces, which may or may not be programmed with software and/or firmware as the means for the indicated elements to implement their desired functionality. Such functionality is supported by the hardware shown in FIG. 2.

At 302, hardware of the communication device 102, for example the one or more input devices 210 and/or 224, captures at least one acoustic signal from the environment surrounding the communication device 102. In some example embodiments, the communication device 102 adapts acoustic processing, such as for or during voice recognition processing and/or processing of voice calls, based on characterization of external acoustic stimuli. Accordingly, at 304, the communication device 102 is configured to characterize an acoustic environment external to the communication device 102 using the at least one captured acoustic signal. The details of how the external environment is characterized are explained in further detail below. At 306, acoustic processing within the communication device is adapted based on the characterized acoustic environment.

In one embodiment, one or more modules, such as a noise suppression module 308, an echo cancellation module 310, a volume control module 312, a reverberation removal module 314, and/or an equalization module 316 is configured to adapt acoustic processing of the communication device 102. The modules 308-316, in one embodiment, execute on the communication device 102, and in particular, in some embodiments, the modules 308-316 execute on a processor, such as processor 204. In other embodiments, the modules 308-316 are implemented in hardware, firmware, software, or some combination of firmware software or hardware. Further, in one embodiment, the modules 308-316 are configured to adapt acoustic processing of the communication device 102 based on characterization of the acoustic environment of the communication device 102.

In one embodiment, characterization of the acoustic environment and the resultant acoustic processing are implemented during a training or enrollment process used to create a voice model on the communication device 102. In another embodiment, characterization of the acoustic environment and the resultant acoustic processing are implemented during the voice recognition of user speech on the communication device 102 in order to control the communication device 102. In a particular embodiment, voice recognition processing includes processing blocks 308-314 as well as voice recognition parameter change, voice recognition algorithm change, voice recognition model change, and/or voice recognition database change. In still another embodiment, the characterization of the acoustic environment and the resultant adaption of acoustic processing occur while the user 104 is engaged in a voice or data call. However, when acoustic characterization of the acoustic environment occurs while the user 104 is engaged in a call, the communication device 102, in one example, does not emit audible sounds that may interfere with the call.

Figure 4:
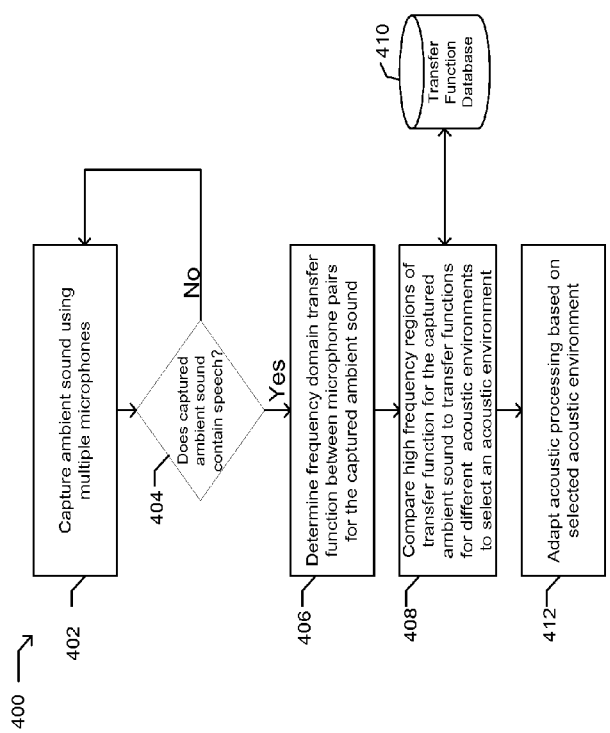
FIG. 4 is a logical flowchart illustrating a method for adapting acoustic processing in a communication device based on captured ambient sounds.

Turning now to FIG. 4, which depicts an example method 400 for capturing and processing the at least one acoustical signal. One particular embodiment includes capturing 402 and processing at least one acoustical signal from ambient sounds external to the communication device 102 using multiple microphones of the communication device 102. In this embodiment the communication device 102 is configured to capture ambient sounds. For example, the audio input device(s) 224 are configured to capture 402 ambient sounds external to the communication device 120. In one embodiment, the method 400 determines 404 if the ambient sound includes voice speech. If the ambient sound does not include voice utterances or vocalized speech, the microphones 224 continue to capture 402 ambient sounds without further processing the captured ambient sound. If, however, the ambient sound includes user speech, frequency domain transfer functions between at least two microphone pairs 224 are determined 406 for the captured ambient sound.

In one embodiment, determining the acoustic environment includes comparing one or more transfer functions derived from two or more microphones. For example, high frequency regions (as defined by a frequency range over which the device 102 operates or by detecting peaks for instance) of transfer functions for the captured ambient sound are compared 408 to transfer functions for different acoustic environments. As shown, the communication device 102 includes a transfer function database 410 disposed, for instance, in memory 206. The transfer function database 410 includes transfer functions for known environments and use-cases. For example, the stored transfer functions include cases where the communication device 102 is laying on a table, in free-space, near a wall, sitting on a soft surface, such as a car seat, in a purse or pocket, etc.

At 408, at least a portion (such as high frequency regions) of the transfer functions associated with the captured acoustic signal is then compared against the transfer functions stored in the transfer function database 410 to select an acoustic environment in which the communication device 102 resides. Acoustic processing of the communication device 102 is then adapted 412 based on the selected acoustic environment.

In a further embodiment by reference to FIG. 4, the device 102 performs method 400 using other ambient sounds in the environment besides vocalized speech. In another embodiment, the communication device 102 characterizes the environment by outputting an acoustic signal and capturing at least one reflection of the output acoustic signal. In one example, the communication device 102 uses output transducers, such as audio output(s) 218, to produce a stimulus, such as an audible or inaudible acoustic signal. The communication device 102 also uses microphones, such as audio input(s) 224 to capture direct and reflected acoustic signals that the audio outputs 218 originally generated.

An audible acoustic signal includes, in one embodiment, any of a variety of acoustic signals that can be heard by a user including tones, multi-tone bursts, wavelets, swept sine signals, music or speech signals, or any alert or multimedia tone normally produced by the device. An inaudible acoustic signal includes, in one embodiment, any of a variety of acoustic signals that cannot readily be heard by a user including ultrasound, infrasound, or wide-band signals whose energy is sufficiently spread across the acoustic spectrum to make it practically undetectable by a human user. A wideband signals include those where message bandwidth significantly exceeds the coherence bandwidth of the channel in which the message is sent. Ultrasound or infrasound signals includes, in one embodiment, tones, multi-tone bursts, wavelets, swept sine signals, and the like.

Figure 5:
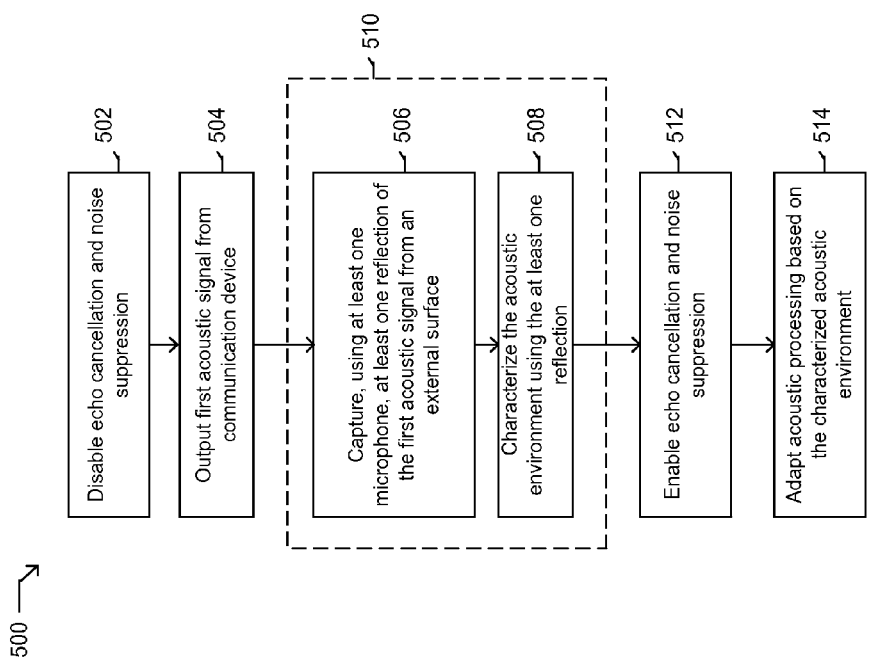
FIG. 5 is a logical flow chart illustrating a method for adapting acoustic processing in a communication device based on outputting and capturing at least one acoustic signal.

Turning now to FIG. 5, which depicts a method 500 for adapting acoustic processing in the communication device 102 based on outputting and capturing at least one return acoustic signal. In this case, each return acoustic signal includes both the direct path acoustic signal from acoustic output hardware to the acoustic input hardware, and a "reflection" of an acoustic signal output from acoustic output hardware in the device, such as one or more speakers. The direct acoustic signal is dependent primarily on the structure of the device, whereas the reflections are dependant primarily on the environment that the device resides in. The reflections are from or off of one or more surfaces in the environment surrounding the device.

In the embodiment depicted, the method 500 includes disabling 502 echo cancellation and noise suppression before outputting 504 a first acoustic signal from the communication device 102. Echo cancellation and noise suppression are disabled to assist in getting a better acoustic transfer function between the speakers 218 and the microphones 224. In an alternative embodiment, the echo cancellation and noise suppression remains enabled.

The communication device 102 outputs the first acoustic signal in a number of different ways. In one embodiment, the communication device 102 outputs the first acoustic signal as a predetermined audible audio signal, such as a pulsed signal. In another embodiment, the communication device 102 treats all sounds that the communication device 102 emits during regular operations, for example, tones, prompts, ringtones, downlink audio, multimedia output, as the first acoustic signal emitted from the communication device 102. Treating all sounds of the communication device 102 as the first acoustic signal allows the communication device 102 to continually characterize the external environment using audio that the communication device 102 normally outputs. In still another embodiment, the communication device 102 emits wide-band audio signals below ambient noise as the first acoustic signal. Using such wide-band emissions resolves the need to rely on the audio that the communication device 102 normally produces.

In one embodiment, the communication device 102 outputs the first acoustic signal as a predetermined audible audio signal that is a prompt to let the user 104 know that he/she can begin speaking to the device 102. In another embodiment, the first acoustic signal is the prompt telling the user 104 to begin recording a training or enrollment phrase.

At 506, at least one microphone captures at least one reflection of the first acoustic signal from a surface of an object external to the communication device 102. The acoustic environment is characterized 508 using the at least one captured signal. The echo cancellation and noise suppression are enabled 512. Thus, in one embodiment, echo cancellation processing and noise suppression are disabled before capturing the at least one reflection of the first acoustic signal, and the echo cancellation and noise suppression are enabled after characterizing the acoustic environment.

As previously described, the acoustic processing is adapted 514 based on the characterized acoustic environment. Adaptation of the acoustic processing, includes, in one embodiment, cancelling individual strong reflections in the acquired signal, ending acquisition or processing before a first strong reflection arrives, performing a de-reverb process on the acquired signal, modifying gain parameters, modifying spectral equalization, or modifying noise reduction parameters of signals intended to be recognized.

Block 510 in general represents the capturing of one or more acoustic signals and characterizing the acoustic environment external to the communication device using the at least one captured acoustic signal, as shown in blocks 506 and 508. The remaining FIGS. 6-11 include different methods and manners of implementing block 510 and particularly blocks 506 and 508 of block 510.

Figure 6:
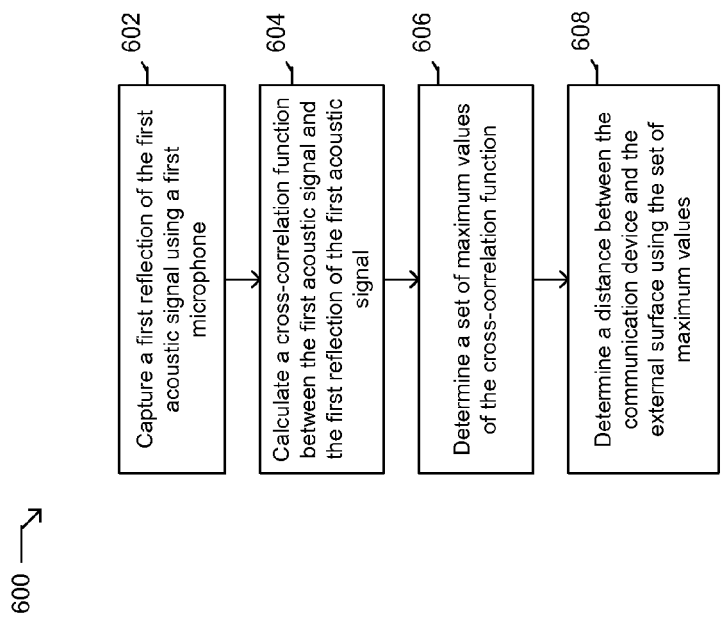
FIG. 6 is a logical flow chart illustrating another method for adapting acoustic processing in a communication device based on outputting and capturing at least one acoustic signal.

Turning now to FIG. 6, which depicts one example of a method 600 for performing time domain analysis using a cross-correlation function to characterize the environment surrounding the communication device 102. At 602, a first microphone captures a first reflection of the first acoustic signal. A cross-correlation function between the first acoustic signal and captured signal, which contains for instance the direct path acoustic signal, and the first reflection of the first acoustic signal is calculated at 604. Based on these calculations, a set of maximum values of the cross-correlation functions is determined 606. These values are used to determine 608 a distance between the communication device and the external surface, which caused the first reflection. The determined distance gives an indication of how close the communication device 102 is to an object.

In another example using time domain analysis, a microphone 224 captures reflection(s) of the first acoustic signal and compares those captured reflections with time delays associated with known paths, such as a direct path between a speaker and a microphone. In other words, the communication device 102 measures the time delay of a reflection as compared to a known direct signal to determine if an object in the external environment is close to the communication device 102. If the time delay is short, the phone may be positioned near an object. For example, the communication device 102 could be resting on a table. One way of detecting this time delay would be to use an echo canceller or a dedicated device on the communication device 102 to track an echo path between each speaker 218 and each microphone 224.

Figure 7:
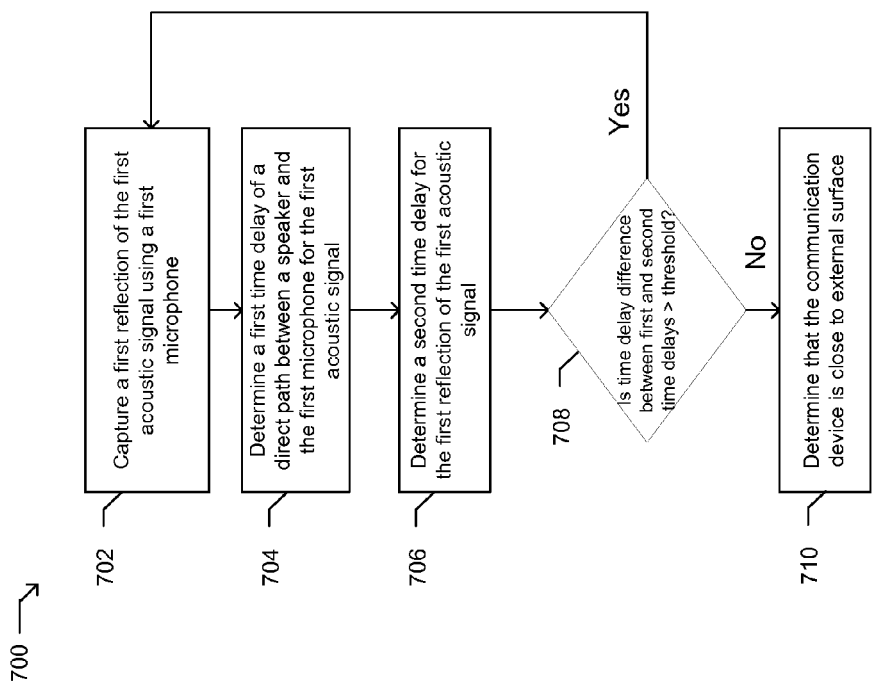
FIG. 7 is a logical flow chart illustrating a further method for adapting acoustic processing in a communication device based on outputting and capturing at least one acoustic signal.

Turning now to FIG. 7, which depicts one embodiment of a method 700 of determining a proximity to an external object based on a captured reflection of an output acoustic signal. A first reflection of the first acoustic signal is captured 702 from the surface external to the communication device 102 using a first microphone, such as microphone 224. A first time delay of a direct path between a speaker and the first microphone is determined 704 for the first acoustic signal. At 706, a second time delay for the first reflection of the first acoustic signal is determined. A comparison 708 of the first time delay and second time delay is performed. If the difference between the first and second time delays is greater than a threshold, the communication device 102 continues to capture 702 reflections. A time delay difference greater than the threshold indicates, in one example, that the communication device 102 is not within close proximity to an external object.

If, on the other hand, the difference between the first and second time delays is not greater than the threshold, the communicate device 102 is close to an external surface, which indicates, in one example, that the communication device 102 is resting on a surface, such as a tabletop, or is near a surface, such as the user's 104 face. In this case, acoustic processing is adapted to account for the close surface. The threshold represents, in one example, a proximal distance that is adjustable in accordance with what is considered to be in close proximity. Thus, if one centimeter is considered to be in close proximity, the threshold is adjusted so that the communication device 102 determines that an external object within one centimeter is determined 710 as close to the external surface.

In one embodiment, the communication device 102 uses one or more microphones 224 to measure the reflected acoustic information at different angles. Beam-forming, in one example, is used to measure the direction from which the reflected signals emanate. The use of multiple virtual microphone beams measuring the echo signal along with spectral characteristics of a reflected signal is used to identify a relative location from the communication device 102 to a surface of an external object.

The use of multiple virtual microphone beams along with the spectral characteristics is also used to determine the type of surface the communication device 102 is on or near and the direction or orientation of that surface relative to the device, e.g., on vehicle seat, against a window, on a hard table, against a hard wall to the left, free field to the front and right, etc. In one embodiment, a cross-correlation function along with the directional information that multiple microphone beamforms provide is used to determine distances in each direction from the communication device 102 to surfaces of the external object.

Figure 8:
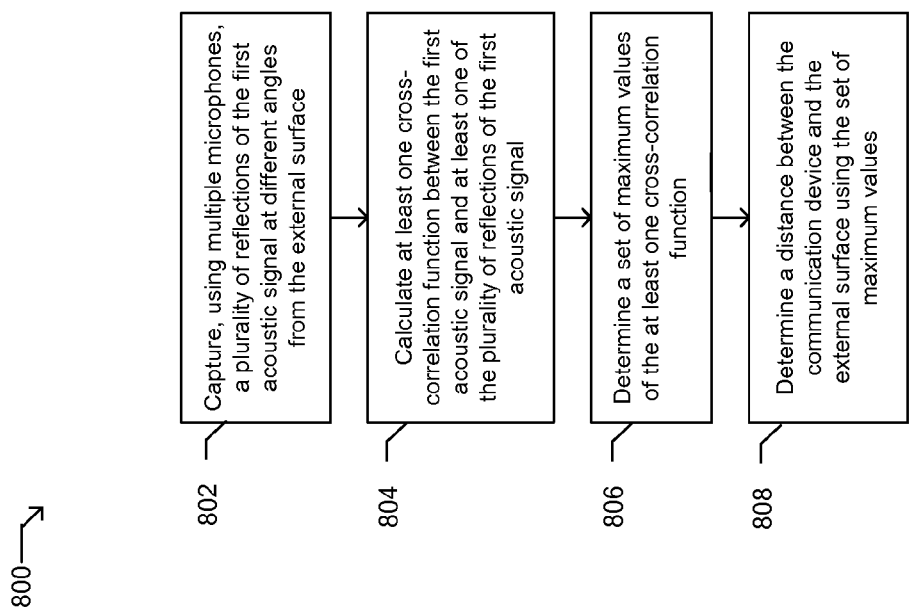
FIG. 8 is a logical flow chart illustrating still another method for adapting acoustic processing in a communication device based on outputting and capturing at least one acoustic signal.

Turning now to FIG. 8, depicted is one embodiment of a method 800 for characterizing the environment external to the communication device 102 using multiple microphones 224. At 802, a plurality of reflections of the first acoustic signal that are reflected from one or more external surfaces is captured using the multiple microphones 234 at different angles from the external surface. At least one cross correlation function between the first acoustic signal and at least one of the plurality of reflections of the first acoustic signal is calculated at 804. A set of maximum values of the at least one cross-correlation function is determined at 806.

A distance between the communication device 102 and the external surfaces is/are determined 808 using the set of maximum values. In other words, a difference between the set of cross-correlation maximum values and cross-correlation values of captured reflection indicates, in one embodiment, indicates a distance to one or more surfaces of an external object that caused the reflection. In another embodiment, more than one value of the at least one cross correlation function is used to determine a distance between the communication device 102 and one or more surfaces of the external object.

As previously described, the communication device 102, in one embodiment, emits the first acoustic signal. When, however, the first acoustic signal is broken into a plurality of frequency bands, the communication device 102 is configured to calculate a distance to a surface of an external object (e.g., an external surface) based on an arrival time of reflections of the different frequency bands. In one embodiment, the communication device 102 emits the first acoustic signal as a plurality of frequency bands on a broadband basis, and the communication device 102 calculates a distance to an external object based on an arrival time of reflections of the different frequency bands.

Figure 9:
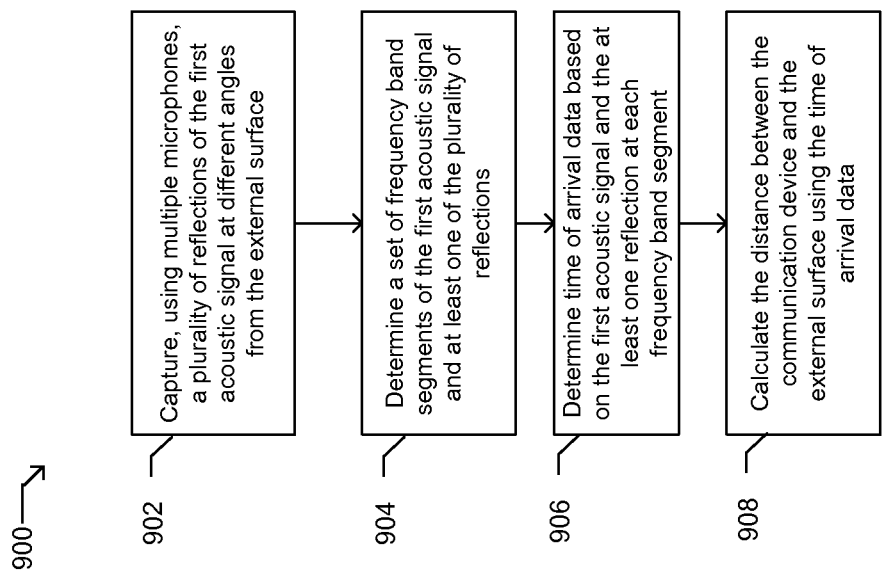
FIG. 9 is a logical flow chart illustrating yet another method for adapting acoustic processing in a communication device based on outputting and capturing at least one acoustic signal.

Turning now to FIG. 9, which depicts an embodiment of a method 900 for characterizing an environment external to the communication device 102 using a plurality of frequency bands. The communication device 102 captures 902, using multiple microphones, a plurality of reflections of the first acoustic signal at different angles from the external surface. At 904, a set of frequency band segments of the acoustic signal and at least one of the plurality of reflections is determined. In an embodiment, the set of frequency band segments includes multiple narrowband segments, where narrowband communications involve channels in which the bandwidth of a message does not significantly exceed the channel's coherence bandwidth. However, the set of frequency band segments could instead include a single or a few broadband segments, where broadband communications refers to wide bandwidth characteristics of a transmission and the medium's ability to simultaneously transport multiple signals and traffic types. Also determined 906 is arrival data based on the first acoustic signal and the at least one reflection at each frequency band segment. The time of arrival data is used to calculate 908 the distance between the communication device 102 and the external surface.

If the time of arrival data indicates that the reflection is received soon after the communication device 102 outputs the first acoustic signal, this indicates that the communication device 102 is near an object. For example, the communication device 102, in one example, is resting against a hard surface, such as a tabletop, leaning against a wall, against the user's 104 face, etc. The relative amplitudes of the plurality of frequency band reflections, determined to be at the same distance from the device, are used to determine the composition of the reflecting surface (e.g., its acoustic impedance).

If the communication device 102 knows the spectrum of the first acoustic signal that is produced, the reflected acoustic spectrum is used to characterize absorptive characteristics of the external object. That is, spectral differences between the first acoustic signal and the reflected acoustic spectrum are used to characterize absorptive characteristics of the external object. For example, a return spectrum with an attenuation of high frequencies indicates that the reflective surface is absorptive. Thus, in one embodiment, this attenuation of high frequencies identifies an absorptive surface versus a hard surface, such as, for example, a vehicle seat versus a hard table.

In other embodiments, broadband energy differences between outgoing and incoming signals are used to characterize the reflecting surface based on absorption of that surface. Thus, if the reflected signal exhibits higher energy in a lower frequency band, this indicates, in one example, that the reflective object is absorptive. In still another embodiment, a frequency domain transfer function between the first acoustic signal and each reflected beam-formed signal is calculated. The acoustic absorption characteristics in each direction are determined from the frequency dependent loss in each beam-formed transfer function.

Figure 10:
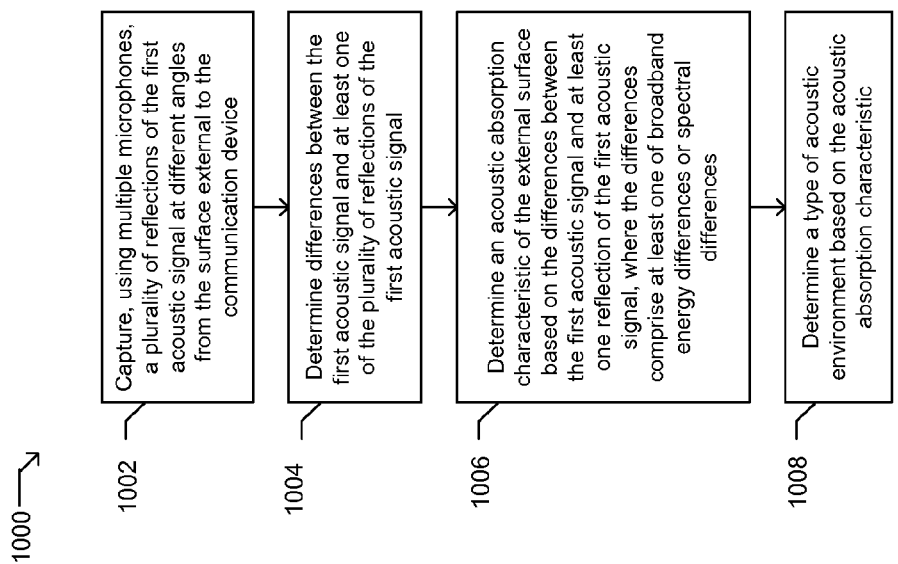
FIG. 10 is a logical flow chart illustrating another method for adapting acoustic processing in a communication device based on outputting and capturing at least one acoustic signal.

Turning now to FIG. 10, which depicts still another embodiment of a method 1000 for characterizing the environment external to the communication device 102 using multiple microphones. A plurality of reflections of the first acoustic signal that are reflected from the one or more surfaces external to the communication device 102 are captured 1002 at different angles using multiple microphones. Differences between the first acoustic signal and at least one of the plurality of reflections of the first acoustic signal are determined 1004 from the surface(s) external to the communication device 102. An absorption characteristic of the external surface is determined 1006 based on differences between the first acoustic signal and at least one reflection of the first acoustic signal. In one embodiment, the differences include at least one of spectral differences or broadband energy differences.

When comparing the first acoustic signal and the at least one reflection, if the communication device 102 determines that the frequency characteristics show a diminishment in higher frequencies, or if the broadband energy differences indicate less energy in the higher frequencies of the at least one reflected signal, this indicates in one example that the reflective surface is absorptive. In another embodiment, the differences between the signals are different phases of the reflected signal. For example, if the reflective surface is absorptive, the phase upon reflection in certain frequencies is different than if the reflective surface is not absorptive. Accordingly, these factors are taken into account when a type of acoustic environment is determined 1008 based on the acoustic absorption characteristic.

Figure 11:
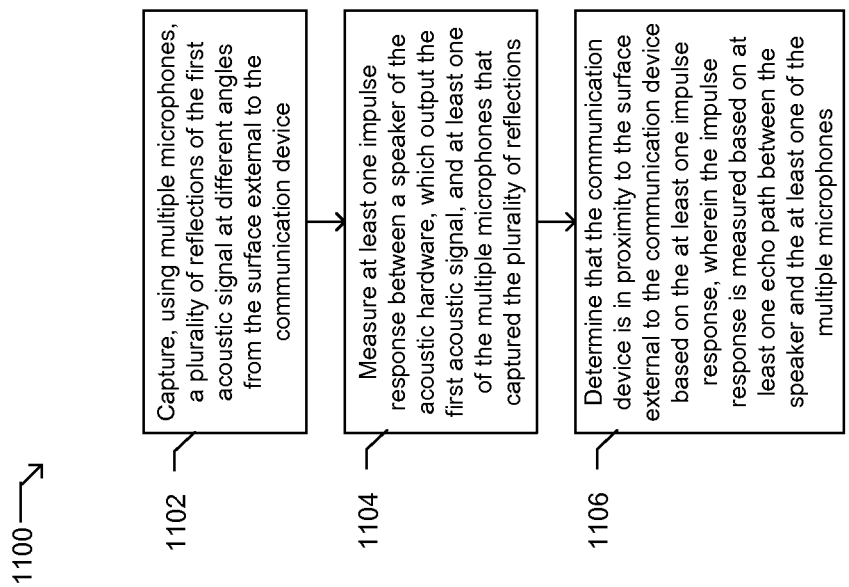
FIG. 11 is a logical flow chart illustrating still another method for adapting acoustic processing in a communication device based on outputting and capturing at least one acoustic signal.

In one embodiment, impulse response(s) are measured at one or more microphones 224. The impulse response(s) are compared between the speaker(s) 218 and each microphone 224 to detect a close surface based on a time reflection pattern measured by the one or more microphones 224. Turning now to FIG. 11, which depicts yet another embodiment of a method 1100 for characterizing the environment external to the communication device 102 using multiple microphones. The communication device 102 captures 1102, using multiple microphones, a plurality of reflections of the first acoustic signal at different angles from the one or more surfaces external to the communication device. A measurement is determined 1104 of at least one impulse response between a speaker of the acoustic hardware, which output the first acoustic signal, and at least one of the multiple microphones that captured the plurality of reflections.

At 1106, it is determined that the communication device 102 is in proximity to the surface external to the communication device 102 based on the at least one impulse response. In one embodiment, the impulse response is measured based on at least one echo path between the speaker and the at least one of the multiple microphones. The impulse response indicates, in one example, how far the reflective surface is away from the communication device 102, and the multiple beam-forms indicate a general direction. Thus, with the impulse response and the multiple beam-forms, a general direction and distance of the reflective surface is determined.

In one embodiment, as previously described in relation to FIG. 3, the communication device 102 includes at least one of a noise suppression module 308 configured to provide noise suppression of the received acoustic signal, an echo cancellation module 310 configured to provide echo cancellation of the received acoustic signal, a volume control module 312 configured to control the volume of at least one microphone of the acoustic hardware while capturing a received acoustic signal, a reverberation removal module 314 configured to provide de-reverberation of the received acoustic signal, and an equalization module 316 configured to provide equalization of the received acoustic signal. At least one of the noise suppression module 308, the echo cancellation module 310, the reverberation removal module 314, the volume control module 312, or the equalization module 316 is configured to be adapted based on a characterized acoustic environment.

In addition to modules 308-314, additional modules or parameters that can be adapted based on a characterized acoustic environment include, but are not limited to, voice recognition algorithm parameters, voice recognition algorithms, voice recognition models, voice recognition databases, and any other type of acoustic processing. Further, adaption of the noise suppression module 308, includes, in one example, a change of noise suppression algorithm parameters, a change out of one noise suppression algorithm for another, a change in the number or configuration of microphones used in the noise suppression, and a change in the orientation of a virtual microphone beam based on the distance, absorption, and/or orientation of the reflected surface.

Also, as previously described, the communication device 102 is configured to adapt acoustic processing based on the characterized acoustic environment. For example, either through ambient acoustic signals, reflected acoustic signals, or either through the use of transfer functions, time domain analysis, or other methods described herein, the communication device 102 determines, in some examples, that it is resting against a hard surface, in an enclosed area, such as a purse or pocket, in free-space, or some other type of environment.

When the acoustic environment is determined, the acoustic processing of the communication device 102 is adapted. For example, if the communication device 102 is in a purse, pocket, or other enclosed environment, the acoustic processing system would not work as well. Therefore, in one example, if the communication device 102 is in an enclosed environment, the acoustic processing system is turned off. If, on the other hand, the communication device 102 is resting on a tabletop or against a hard surface such that, for example, the rear microphones are occluded, the volume control module 312 is used to turn off the occluded microphones.

If the communication device 102 is in an environment having echoes, the echo cancellation module 310, in one example, is adapted to account for this increased echo. Still further, if the communication device 102 determines the direction of a reflective surface that is causing reverberations, the communication device 102, in one example, adjusts the noise suppression module 308, the de-reverberation module 314 and/or beam-forms associated with microphones that pick up acoustic signals from the direction of the reflective surface. Still further, if the communication device 102 is resting against an absorptive surface, in one embodiment, the communication device 102 boosts high frequency signals, or attenuates low frequency signals using the equalization module 316, for example.

In the foregoing specification, specific embodiments have been described. However, one of ordinary skill in the art appreciates that various modifications and changes can be made without departing from the scope of the invention as set forth in the claims below. Accordingly, the specification and figures are to be regarded in an illustrative rather than a restrictive sense, and all such modifications are intended to be included within the scope of present teachings.

The benefits, advantages, solutions to problems, and any element(s) that may cause any benefit, advantage, or solution to occur or become more pronounced are not to be construed as a critical, required, or essential features or elements of any or all the claims. The invention is defined solely by the appended claims including any amendments made during the pendency of this application and all equivalents of those claims as issued.

Moreover in this document, relational terms such as first and second, top and bottom, and the like may be used solely to distinguish one entity or action from another entity or action without necessarily requiring or implying any actual such relationship or order between such entities or actions. The terms "comprises," "comprising," "has," "having," "includes," "including," "contains," "containing" or any other variation thereof, are intended to cover a non-exclusive inclusion, such that a process, method, article, or apparatus that comprises, has, includes, contains a list of elements does not include only those elements but may include other elements not expressly listed or inherent to such process, method, article, or apparatus. An element proceeded by "comprises . . . a," "has . . . a," "includes . . . a," or "contains . . . a" does not, without more constraints, preclude the existence of additional identical elements in the process, method, article, or apparatus that comprises, has, includes, contains the element. The terms "a" and "an" are defined as one or more unless explicitly stated otherwise herein. The terms "substantially," "essentially," "approximately," "about" or any other version thereof, are defined as being close to as understood by one of ordinary skill in the art, and in one non-limiting embodiment the term is defined to be within 10%, in another embodiment within 5%, in another embodiment within 1% and in another embodiment within 0.5%. The term "coupled" as used herein is defined as connected, although not necessarily directly and not necessarily mechanically. A device or structure that is "configured" in a certain way is configured in at least that way, but may also be configured in ways that are not listed.

It will be appreciated that some embodiments may be comprised of one or more generic or specialized processors (or "processing devices") such as microprocessors, digital signal processors, customized processors and field programmable gate arrays (FPGAs) and unique stored program instructions (including both software and firmware) that control the one or more processors to implement, in conjunction with certain non-processor circuits, some, most, or all of the functions of the method and/or apparatus described herein. Alternatively, some or all functions could be implemented by a state machine that has no stored program instructions, or in one or more application specific integrated circuits (ASICs), in which each function or some combinations of certain of the functions are implemented as custom logic. Of course, a combination of the two approaches could be used.

Moreover, an embodiment can be implemented as a computer-readable storage medium having computer readable code stored thereon for programming a computer (e.g., comprising a processor) to perform a method as described and claimed herein. Examples of such computer-readable storage mediums include, but are not limited to, a hard disk, a CD-ROM, an optical storage device, a magnetic storage device, a ROM (Read Only Memory), a PROM (Programmable Read Only Memory), an EPROM (Erasable Programmable Read Only Memory), an EEPROM (Electrically Erasable Programmable Read Only Memory) and a Flash memory. Further, it is expected that one of ordinary skill, notwithstanding possibly significant effort and many design choices motivated by, for example, available time, current technology, and economic considerations, when guided by the concepts and principles disclosed herein will be readily capable of generating such software instructions and programs and ICs with minimal experimentation.

The Abstract of the Disclosure is provided to allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in various embodiments for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus the following claims are hereby incorporated into the Detailed Description, with each claim standing on its own as a separately claimed subject matter.

We claim:

1. A method for adapting acoustic processing in a communication device, the method comprising:
   capturing, using multiple microphones of the communication device, at least one acoustic signal having captured ambient sound;
   determining, for the captured ambient sound, a frequency domain transfer function between a pair of the multiple microphones;
   comparing at least a portion of the frequency domain transfer function to stored transfer functions for different acoustic environments to select an acoustic environment; and
   adapting acoustic processing within the communication device based on the selected acoustic environment.

2. The method of claim 1, wherein capturing ambient sound comprises capturing user speech.

3. The method of claim 1, wherein adapting the acoustic processing comprises at least one of adapting voice recognition processing or adapting processing of voice calls.

4. A method for adapting acoustic processing in a communication device, the method comprising:
   outputting a first acoustic signal from the communication device;
   capturing at least one acoustic signal using multiple microphones of the communication device, wherein the at least one acoustic signal includes a plurality of reflections of the first acoustic signal at different angles from a surface external to the communication device;
   characterizing an acoustic environment external to the communication device using the at least one captured acoustic signal; and
   adapting acoustic processing within the communication device based on the characterized acoustic environment.

5. The method of claim 4, wherein capturing at least one acoustic signal using multiple microphones comprises capturing, using a first microphone, a first reflection of the first acoustic signal from the surface external to the communication device, and wherein characterizing the acoustic environment comprises:
   calculating a cross-correlation function between the first acoustic signal output from the communication device and the first reflection of the first acoustic signal from the surface external to the communication device;
   determining a set of maximum values of the cross-correlation function;
   determining a distance between the communication device and the surface external to the communication device using the set of maximum values.

6. The method of claim 4 wherein capturing at least one acoustic signal using multiple microphones comprises capturing, using a first microphone, a first reflection of the first acoustic signal from the surface external to the communication device, and wherein characterizing the acoustic environment comprises:
   comparing a first time delay determined for the first acoustic signal to a second time delay determined for the first reflection of the first acoustic signal to determine a time delay difference;
   determining a proximal distance between the communication device and the surface external to the communication device based on the time delay difference.

7. The method of claim 4, wherein characterizing the acoustic environment comprises:
   calculating at least one cross-correlation function between the first acoustic signal output from the communication device and at least one of the plurality of reflections of the first acoustic signal from the surface external to the communication device;
   determining a set of maximum values of the at least one cross-correlation function;
   determining a distance between the communication device and the surface external to the communication device using the set of maximum values.

8. The method of claim 4, wherein characterizing the acoustic environment comprises:
   determining a set of frequency band segments of the first acoustic signal and at least one of the plurality of reflections;

determining time of arrival data based on the first acoustic signal and the at least one reflection at each frequency band segment;

calculating the distance between the communication device and the surface external to the communication device using the time of arrival data.

9. The method of claim 4, wherein characterizing the acoustic environment comprises:

determining differences between the first acoustic signal output from the communication device and at least one of the plurality of reflections of the first acoustic signal from the surface external to the communication device;

determining an acoustic absorption characteristic of the surface external to the communication device based on the differences between the first acoustic signal and at least one reflection of the first acoustic signal.

10. The method of claim 9 wherein the differences between the first acoustic signal and at least one reflection of the first acoustic signal comprises at least one of:

broadband energy differences; or spectral differences.

11. The method of claim 9, wherein characterizing the acoustic environment further comprises determining the acoustic environment based on the acoustic absorption characteristic.

12. The method of claim 4, wherein characterizing the acoustic environment comprises:

measuring at least one impulse response between a speaker of the acoustic hardware, which output the first acoustic signal, and at least one of the multiple microphones that captured the plurality of reflections;

determining that the communication device is in proximity to the surface external to the communication device based on the at least one impulse response.

13. The method of claim 12, wherein the at least one impulse response is measured based on at least one echo path between the speaker and the at least one of the multiple microphones.

14. The method of claim 4 further comprising disabling echo cancellation processing and noise suppression before capturing the at least one reflection of the first acoustic signal and enabling the echo cancellation and noise suppression after characterizing the acoustic environment.

15. The method of claim 4, wherein the first acoustic signal comprises one of:

an audio signal played from a speaker of the acoustic hardware for performing the method;

an inaudible wide-band emission from the communication device; or an audible sound emitted while operating the communication device.

16. A communication device configurable based on an acoustic environment, the communication device comprising:

acoustic hardware configured to emit a first acoustic signal and including a plurality of microphones to capture at least one acoustic signal comprising at least one of ambient sound or at least one reflection of the first acoustic signal;

a processor configured to characterize an acoustic environment external to the communication device using the at least one captured acoustic signal; and an acoustic processing system configured to provide acoustic processing of a received acoustic signal, wherein the acoustic processing system is adaptable based on the characterized acoustic environment.

17. The communication device of claim 16, wherein the acoustic processing system comprises at least one of:

a noise suppression module configured to provide noise suppression of the received acoustic signal;

an echo cancellation module configured to provide echo cancellation of the received acoustic signal;

a reverberation removal module configured to provide de-reverberation of the received acoustic signal; and a volume control module configured to control the volume of at least one of the plurality of microphones of the acoustic hardware while capturing the received acoustic signal; or an equalization module configured to provide equalization for the received acoustic signal, wherein at least one of the noise suppression module, the echo cancellation module, the reverberation removal module, the volume control module, or the equalization module is configured to be adapted based on the characterized acoustic environment.

18. The communication device of claim 16, wherein the processor is further configured to determine, for the captured at least one acoustic signal, a frequency domain transfer function between a pair of the plurality of microphones.

19. The communication device of claim 18, wherein the processor is further configured to compare at least a portion of the frequency domain transfer function to stored transfer functions for different acoustic environments to characterize the acoustic environment.

20. The communication device of claim 16, wherein the acoustic hardware is further configured to capture, using a first microphone of the plurality of microphones, a first reflection of the first acoustic signal, and the processor is further configured to characterize the acoustic environment by:

comparing a first time delay determined for the first acoustic signal to a second time delay determined for the first reflection of the first acoustic signal to determine a time delay difference; and determining a proximal distance between the communication device and a surface external to the communication device based on the time delay difference.

* * * * *